(12) United States Patent
Shirakawa (10) Patent No.: US 11,630,163 B1
(45) Date of Patent: Apr. 18, 2023

(54) MULTI-CORE CABLE TESTING DEVICE AND METHOD FOR TESTING THE MULTI-CORE CABLE

(71) Applicant: Hitachi Metals, Ltd., Tokyo (JP)

(72) Inventor: Yohei Shirakawa, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 17/553,346

(22) Filed: Dec. 16, 2021

(51) Int. Cl.
  *G01R 31/60* (2020.01)
  *G01R 27/26* (2006.01)
  *H01B 7/00* (2006.01)

(52) U.S. Cl.
  CPC .......... *G01R 31/60* (2020.01); *G01R 27/2605* (2013.01); *H01B 7/0009* (2013.01)

(58) Field of Classification Search
  CPC ........ G01R 27/00; G01R 27/02; G01R 27/26; G01R 27/2605; G01R 31/00; G01R 31/50; G01R 31/58; G01R 31/60; H01B 7/00; H01B 7/0009
  USPC ................. 324/500, 537, 539, 543
  See application file for complete search history.

(56) References Cited

U.S. PATENT DOCUMENTS

| | | | | |
|---|---|---|---|---|
| 4,648,079 | A * | 3/1987 | Stedtnitz | G01R 31/2822 367/13 |
| 10,895,607 | B2 * | 1/2021 | Shirakawa | H01B 13/016 |
| 10,962,607 | B2 * | 3/2021 | Shirakawa | H01B 13/016 |
| 11,009,560 | B2 * | 5/2021 | Shirakawa | G01R 31/60 |

FOREIGN PATENT DOCUMENTS

JP   2004-251771 A   9/2004

* cited by examiner

*Primary Examiner* — Hoai-An D. Nguyen
(74) *Attorney, Agent, or Firm* — McGinn IP Law Group, PLLC (57) ABSTRACT

A multi-core cable testing device is configured to specify a correspondence between ends of an insulated wire at both ends of a multi-core cable including insulated wires. The device includes a signal input unit for inputting a test signal by capacitive coupling into one end of the insulated wire as a testing object at one end of the multi-core cable, a signal output unit for outputting the test signal by capacitive coupling from each end of the insulated wires at the other end of the multicore cable, a correspondence specifying unit for measuring a voltage of the test signal from the signal output unit and for specifying an other side end of the insulated wire based on a measured voltage. At least one of the signal input unit and the signal output unit includes a signal transmission cable for transmitting the test signal and a substrate configured to be connected to the signal transmission cable. The substrate includes a first electrode to be connected to a signal conductor of the signal transmission cable on one main surface of the substrate, and a second electrode to be capacitively coupled to an end of the insulated wire on the other main surface. A transmission path for transmitting the test signal between the first electrode and the second electrode is provided within the substrate, and a shielding layer is provided at the substrate.

8 Claims, 7 Drawing Sheets

MULTI-CORE CABLE TESTING DEVICE AND METHOD FOR TESTING THE MULTI-CORE CABLE

CROSS-REFERENCE TO RELATED APPLICATION

The present application is based on Japanese patent application No. 2020-217644 filed on Dec. 25, 2020, the entire contents of which are incorporated herein by reference.

BACKGROUND OF THE INVENTION

1. Field of the Invention

The present invention relates to a multi-core cable testing device and a method for testing the multi-core cable.

2. Description of the Related Art

Conventionally, a multi-core cable including a plurality of insulated wires has been known. For example, as a multi-core cable for medical use, a probe cable including dozens to hundreds of insulated wires has been known.

For the multi-core cable including dozens to hundreds of insulated wires, it is difficult to provide all the insulated wires with different identification colors (code colors) to specify respective insulators. Further, when the insulated wires are twisted each other within the multi-core cable, the positions of the insulated wires in the multi-core cable in cross-sections at both ends are unstable. Thus, it is difficult to identify (specify) a correspondence between both ends of the insulated wire. Therefore, it is necessary to perform a test (an inspection) to specify the correspondences between the both ends of the insulated wires being exposed at both ends of the multi-core cable in connecting the multi-core cable to a connector, a circuit board or the like.

In the test, for example, a device configured to input a test signal to a conductor of any insulated wire being exposed at one end of the multi-core cable and to measure the test signal output from the conductor of the insulated wire being exposed at the other end of the multi-core cable may be used.

In the test with the use of the device as described above, when the test signal is directly input into the conductor of each insulated wire, a physical contact of an electrode with all of the conductors of the plurality of insulated wires will be required. Thus, it will take a much time to prepare and perform the test. Thus, the testing technique of arranging an electrode on an insulator and inputting a test signal by capacitive coupling is proposed (see e.g., Patent Document 1).

PRIOR ART DOCUMENT

Patent Document 1: JP 2004-251771 A

SUMMARY OF THE INVENTION

It is an object of the invention to provide a multi-core cable testing device that can accurately specify a correspondence between both ends of an insulated wire at both ends of the multi-core cable including a plurality of insulated wires, and a method for testing the multi-core cable.

According to the first embodiment of the invention, a multi-core cable testing device configured to specify a correspondence between ends of an insulated wire at both ends of a multi-core cable comprising a plurality of insulated wires, comprising:

a signal input unit configured to input a test signal by capacitive coupling into one end of the insulated wire selected as a testing object from ends of the plurality of insulated wires being exposed at an end of the multi-core cable;

a signal output unit configured to output the test signal by capacitive coupling from each end of the plurality of insulated wires being exposed at an other end of the multi-core cable; and a correspondence specifying unit configured to measure a voltage of the test signal obtained from the signal output unit and to specify an other side end of the insulated wire as the testing object based on a measured voltage, wherein at least one of the signal input unit and the signal output unit comprises a signal transmission cable for transmitting the test signal and a substrate configured to be connected to the signal transmission cable, wherein a first electrode configured to be connected to a signal conductor of the signal transmission cable is provided on one main surface of the substrate, wherein a second electrode configured to be capacitively coupled with an end of the insulated wire is provided on an other main surface of the substrate, wherein a transmission path configured to transmit the test signal between the first electrode and the second electrode is provided within the substrate, and wherein a shielding layer configured to suppress a noise from entering into the transmission path is provided at the substrate.

According to the second embodiment of the invention, a method for testing a multi-core cable for specifying a correspondence between ends of an insulated wire at both ends of the multi-core cable comprising a plurality of insulated wires, comprises:

inputting a test signal by capacitive coupling into one end of the insulated wire selected as a testing object from ends of the plurality of insulated wires being exposed at an end of the multi-core cable;

outputting the test signal by capacitive coupling from each end of the plurality of insulated wires being exposed at an other end of the multi-core cable; and measuring a voltage of the test signal obtained from the signal output unit and specifying an other side end of the insulated wire as the testing object based on a measured voltage, wherein, in at least one of the step of inputting the test signal and the step of outputting the test signal, a substrate including a first electrode configured to be connected to a signal conductor of a signal transmission cable for transmitting the test signal on one main surface of the substrate, a second electrode provided on an other main surface of the substrate, and a transmission path configured to transmit the test signal between the first electrode and the second electrode within the substrate is used to capacitively couple the second electrode with an end of the insulated wire, and wherein a shielding layer provided at the substrate suppresses a noise from entering into the transmission path.

Advantageous Effects of Invention

According to the present invention, it is possible to provide a multi-core cable testing device that can accurately specify a correspondence between both ends of an insulated wire at both ends of the multi-core cable including a plurality of insulated wires, and a method for testing the multi-core cable.

BRIEF DESCRIPTION OF THE DRAWINGS

Next, preferred embodiment according to the present invention will be described with reference to appended drawings, wherein.

DETAILED DESCRIPTION OF THE PREFERRED EMBODIMENT

An Embodiment of the Present Invention (1) Configuration of a Multi-Core Cable Testing Device A testing device 1 according to the embodiment is configured as a device for specifying correspondences between both ends of insulated wires 3 at both ends of a multi-core cable 2 including a plurality of insulated wires 3.

First, the configuration of the multi-core cable 2 which is a testing object (i.e., an object to be tested) will be explained.

Figure 3A:
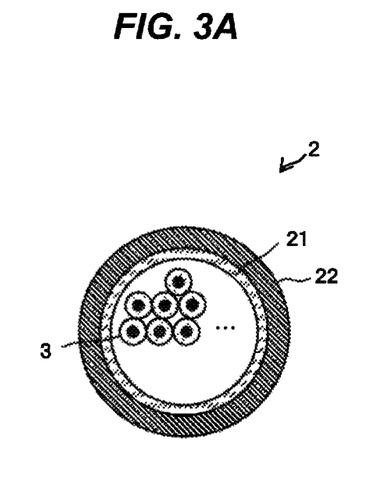
FIG. 3A is a cross-sectional view schematically showing a cross-section of the multi-core cable 2 cut along a direction perpendicular to a longitudinal direction of the multi-core cable 2.

As shown in a cross-sectional view in FIG. 3A, the multi-core cable 2 comprises a plurality of insulated wires 3, a shield 21 provided to collectively cover circumferences of the plurality of bunched insulated wires 3, and a jacket 22 provided to cover a circumference of the shield 21. For example, the shield 21 may be formed by stranding metal wires composed of metals such as copper (Cu) or copper alloy. The jacket 22 may be composed of a material having flexibility and slidability such as silicone rubber. The number of the insulated wires 3 included in the multi-core cable 2 is not limited thereto. For example, the number of the insulated wires 3 can be approximately between 10 to 300.

Figure 3B:
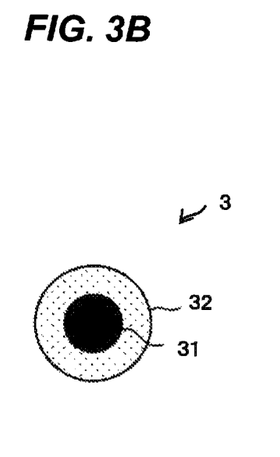
FIG. 3B is a cross-sectional view schematically showing an insulated wire 3 cut along a direction perpendicular to a longitudinal direction of the insulated wire 3.

As shown in the cross-sectional view in FIG. 3B, the insulated wire 3 comprises a conductor 31 serving as a core wire, and an insulative coating layer 32 provided to cover a circumference of the conductor 31. The conductor 31 may be composed of a metal such as copper, copper alloy, aluminum (Al), or aluminum alloy. The insulative coating layer 32 can be composed of an electrically insulative material (dielectric material) such as polyimide, enamel, polyethylene, or polypropylene. For example, an outer diameter of the insulated wire 3 including the insulative coating layer 32 may be approximately 0.2 mm to 0.5 mm. In addition, the insulated wire 3 may have a coaxial structure.

Next, an entire configuration of the testing device 1 will be explained below.

Figure 2:
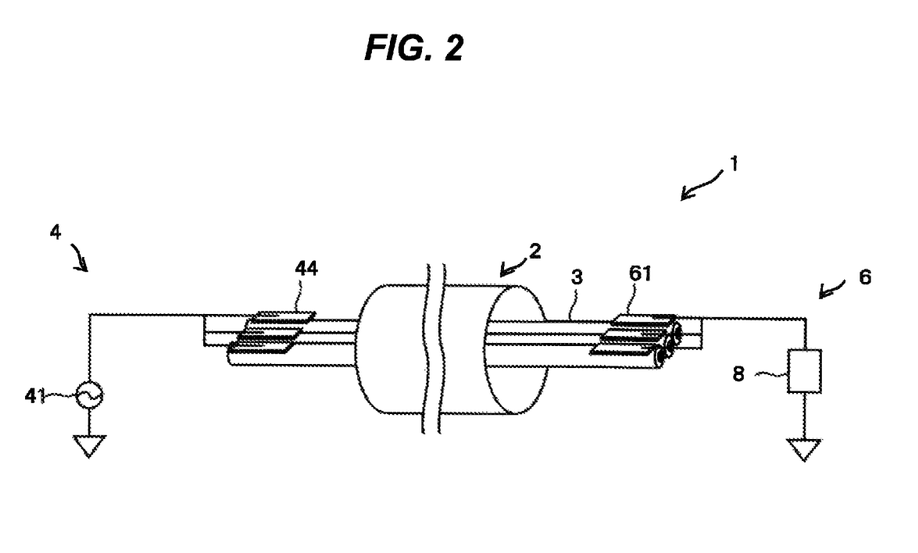
FIG. 2 is a schematic diagram showing a multi-core cable 2 set in the testing device 1.

As shown in FIG. 2, the testing device 1 comprises a signal input unit 4, and a signal output unit 6. The signal input unit 4 is configured to input an alternative current (AC) test signal by capacitive coupling into an end of the insulated wire 3 which is selected as a testing object from ends of the insulated wires 3 being exposed at one end of the multi-core cable 2. The signal input unit 4 comprises a voltage source 41 configured to generate the test signal, and a substrate 44 configured to input the test signal by capacitive coupling into the insulated wire 3 by contacting an outer periphery of the insulated wire 3.

The signal output unit 6 is configured to output an output signal by capacitive coupling from the insulated wire 3 through a substrate 61 pressed against each insulated wire 3. The signal output unit 6 comprises an arithmetic and logic unit (ALU) 8 configured to receive an output signal and specify a correspondence between the ends of the insulated wire 3 based on the received test signal.

Next, the specific configuration of the testing device 1 will be explained below.

Figure 1:
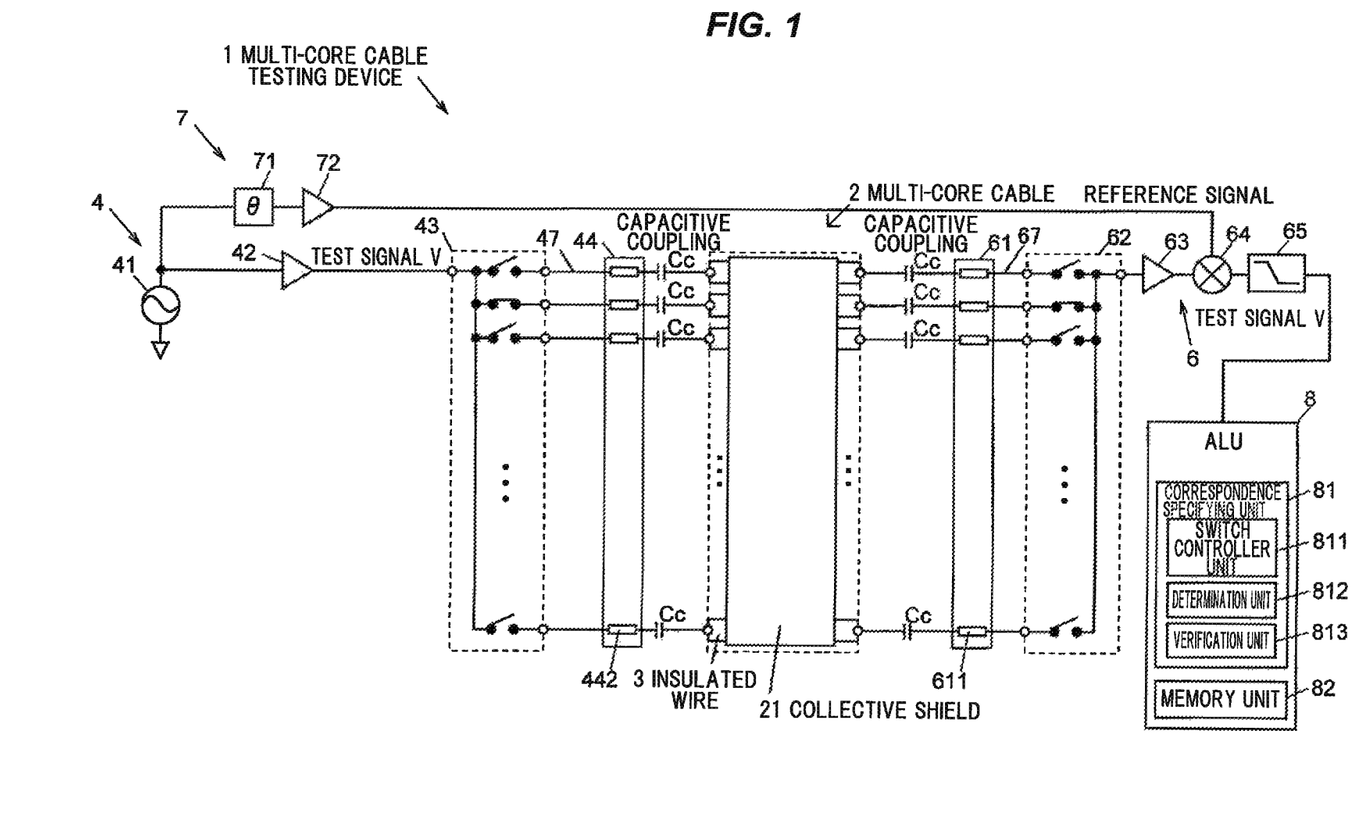
FIG. 1 is a circuitry diagram showing a circuit structure of a testing device 1 according to an embodiment of the present invention.

As shown in the circuit structure of FIG. 1, the testing device 1 comprises the signal input unit 4, the signal output unit 6, the arithmetic and logic unit 8 configured as a computer which achieves a correspondence specifying unit 81. The testing device 1 is configured to test a correspondence between the ends of the insulated wire 3 at both ends of the multi-core cable 2 by setting the multi-core cable 2 between the signal input unit 4 and the signal output unit 6.

The signal input unit 4 is configured to input a test signal V by capacitive coupling into an end of the conductor 31 of the insulated wire 3 selected as the testing object from the ends of the plurality of insulated wires 3 being exposed at one end of the multi-core cable 2.

More specifically, the signal input unit 4 comprises the voltage source 41 for generating the test signal V, a first amplifier 42 for amplifying the test signal V, a first switching device 43 for selecting a destination of the test signal V amplified in the first amplifier 42 by circuit switching, a signal transmission cable 47 for transmitting the test signal V output from the first switching device 43 to the substrate 44, and the substrate 44 to be connected with the signal transmission cable 47.

The signal transmission cable 47 is configured to be substantially similar to the multi-core cable 2 in that the signal transmission cable 47 comprises a plurality of insulated wires, a shield provided to collectively cover circumferences of the plurality of bunched insulated wires, and a jacket provided to cover a circumference of the shield. A core wire of the insulated wire included in the signal transmission cable 47 is served as a signal conductor for transmitting the test signal V. Especially, the insulated wire used for the signal transmission cable 47 preferably has a coaxial structure in order to suppress the influence of an external noise.

On one main surface of the substrate 44, a first electrode 441 to be connected with a signal conductor of the signal transmission cable 47 is provided. On the other main surface of the substrate 44, a second electrode 442 configured to be capacitively coupled with the insulated wire 3 of the multi-core cable 2 (to be described later) is provided. In the substrate 44, a transmission path 430 for transmitting the test signal V between the first electrode 441 and the second electrode 442 is provided. The specific configuration of the substrate 44 will be described below.

According to the configuration, the test signal V is transmitted from the voltage source 41 to the first electrode 441 through the signal transmission cable 47 and the like. The test signal V is transmitted from the first electrode 441 to the second electrode 442 through the transmission path 430 provided in the substrate 44.

Figure 4A:
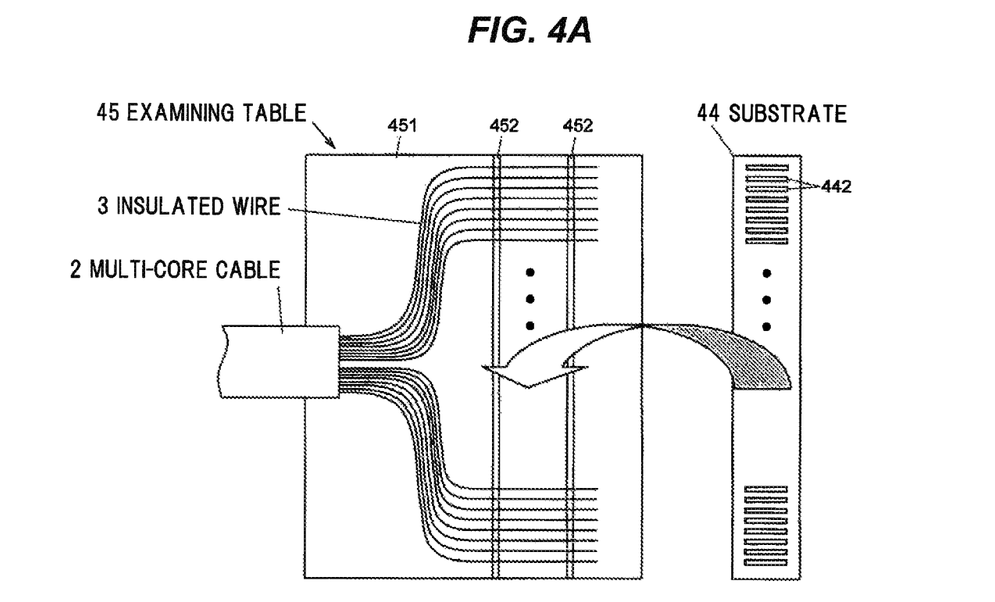
FIG. 4A is an explanatory diagram showing a method for fixing the insulated wire 3 to an examining table 45.
Figure 4B:
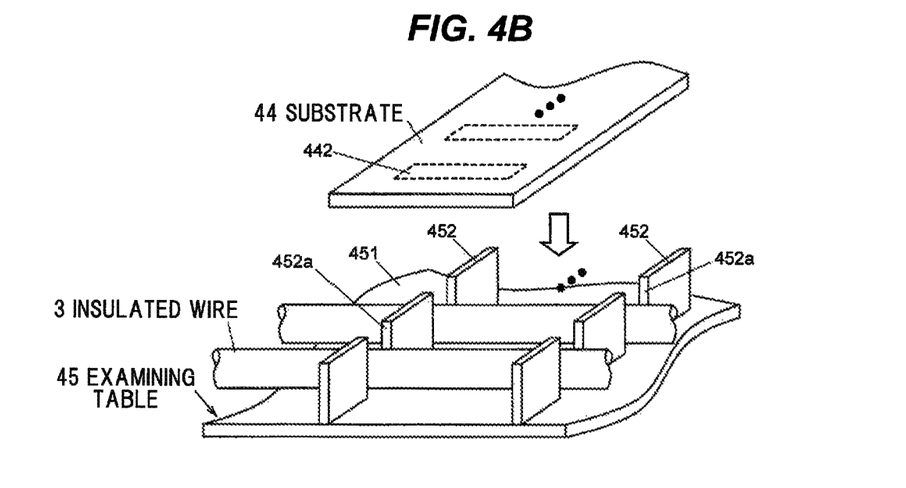
FIG. 4B is an explanatory diagram showing a method for fixing the insulated wire 3 to the examining table 45.

In addition, the signal input unit 4 further comprises an examining table 45 shown in FIGS. 4A and 4B. The plurality of insulated wires 3 being exposed at one end of the multi-core cable 2 are aligned and fixed on the examining table 45. Specifically, the examining table 45 comprises a base 451, and one pair of locking walls 452 arranged to face each other on a main surface of the base 451. A plurality of locking grooves 452a configured to be capable of locking (sandwiching) the insulated wires 3 are arranged on each of the one pair of the locking walls 452 e.g., at equal intervals. Both ends of each of the insulated wires 3 are fixed by being sandwiched by the locking grooves 452a in such a manner that the insulated wires 3 are arranged side by side and substantially in parallel with keeping predetermined intervals on the base 451. Meanwhile, a method for fixing the plurality of insulated wires 3 on the examining table 45 is not limited thereto. For example, an adhesive tape adhered on the base 451 may be used. The interval of arranging the insulated wires 3 may be suitably changed.

As described above, the test signal V is transmitted to the second electrode 442. As shown in FIG. 4A, the second electrodes 442 are provided to be arranged in line on one main surface of the substrate 44 with keeping an arrangement interval similar to the plurality of insulated wires 3 to be fixed on the examining table 45 along an alignment direction of the insulated wires 3. In the meantime, the number of the second electrodes 442 may be approximately equal to the number of the insulated wires 3 to be fixed on the locking grooves 452a or be more than the number of the insulated wires 3.

The second electrodes 442 may be configured to respectively abut on outer peripheries of the plurality of insulated wires 3 by respectively pressing the second electrodes 442 provided on the substrate 44 against the respective insulated wires 3 fixed on the base 451. That is, the conductor 31 of the insulated wire 3 and the second electrode 442 may be arranged to face (to be capacitively coupled) each other via an insulative coating layer 32 comprising a dielectric material. The test signal V can be input by capacitive coupling into the conductor 31 of the insulated wire 3 arranged to face the second electrode 442 by transmitting the test signal V to the second electrode 442 in this state.

In the meantime, it is preferable to use an AC signal as the test signal V not a Direct Current (DC) signal, so as to improve the input efficiency of the test signal using the capacitive coupling. In this case, a frequency of the test signal V can be suitably set in accordance with the configuration of the multi-core cable 2 or the like. For example, the frequency may be smaller than an intrinsic resonance frequency of the multi-core cable 2. For example, the frequency of the test signal V can be set at a predetermined frequency within a range of 1 to 10 MHz.

In the meantime, FIGS. 4A and 4B show only a configuration of a part of various configurations included in the substrate 44 for convenience. The detail configuration of the substrate 44 will be described below.

The signal output unit 6 is configured to output test signals by capacitive coupling from respective ends of the plurality of insulated wires 3 being exposed at the other end of the multi-core cable 2.

Specifically, the signal output unit 6 comprises an examining table (not shown) which is configured to be similar to the examining table 45, a substrate 61, and a signal transmission cable 67 which is configured to be similar to the signal transmission cable 47.

The substrate 61 has a substantially similar configuration to the substrate 44. On one main surface of the substrate 61, a third electrode (not shown) to be connected with a signal conductor (core wire) of the signal transmission cable 67 is provided. On the other main surface of the substrate 61, a fourth electrode 611 (see e.g., FIG. 1) configured to be capacitively coupled with the insulated wire 3 of the multi-core cable 2 is provided, similarly to the second electrode 442. In addition, a transmission path (not shown) for transmitting the test signal V between the third electrode and the fourth electrode 611 is provided in the substrate 61. The third electrode, the fourth electrode 611, and the transmission path included in the substrate 61 are configured to be substantially similar to the first electrode 441, the second electrode 442, and the transmission path 430, which are included in the substrate 44.

The fourth electrodes 611 may be configured to respectively abut on outer peripheries of the plurality of insulated wires 3 by respectively pressing the fourth electrodes 611 provided on the substrate 61 against the respective insulated wires 3 fixed on the examining table (not shown). That is, the conductor 31 of the insulated wire 3 and the fourth electrode 611 may be arranged to face (to be capacitively coupled) each other via the insulative coating layer 32 comprising a dielectric material. The test signal V can be input by capacitive coupling into the fourth electrode 611 arranged to face the conductor 31 of the insulated wire 3 by transmitting the test signal V to the conductor 31 of the insulated wire 3 in this state. Thus, the test signal V is transmitted from the fourth electrode 611 to the third electrode (not shown) through the transmission path (not shown) provided in the substrate 61.

The signal output unit 6 comprises a second switching device 62 for selecting an output of the test signal V which is transmitted from the third electrode through the signal transmission cable 67 by circuit switching, a second amplifier 63 for amplifying the test signal V which is output from the second switching device 62, a multiplier 64 for multiplying the test signal V which is amplified in the second amplifier 63 with a reference signal which is output from a reference signal generating circuit 7, thereby generating a new test signal V, and a low-pass filer 65 for filtering a high frequency component from the new test signal V which is generated in the multiplier 64.

The reference signal generating circuit 7 comprises a phase shifter 71 for adjusting a phase of the test signal V which is branched from the voltage source 41, thereby providing the reference signal, and a third amplifier 72 for amplifying the reference signal from the phase shifter 71 and outputting the amplified reference signal to the multiplier 64. A phase shift amount in the phase shifter 71 is suitably adjusted with considering the phase shift in capacitive coupling or transmitting in the multi-core cable 2 in such a manner that the test signal V and the reference signal have the same phase in the multiplier 64. In the multiplier 64, the test signal V amplified in the second amplifier 63 is multiplied with the reference signal output from the reference signal generating circuit 7, which has the same phase and the same frequency with the test signal V, to provide the new test signal V. The new test signal V obtained by this multiplication comprises a DC component and a component with a frequency which is twice the original frequency. The low-pass filter 65 filters the components to remove the twice frequency component and to retain only the DC component as a final test signal V to be output to the arithmetic and logic unit 8.

The arithmetic and logic unit 8 comprises a correspondence specifying unit 81 which is configured to sequentially measure the test signal V obtained from the signal output unit 6, i.e., a voltage of the final test signal V consisted of the DC component, while switching the second switching device 62, and to specify the insulated wire 3 to be tested (as the testing object), i.e., the other end of the insulated wire 3 having the conductor 31 to which the test signal V is input in accordance with the switching operation of the first switching device 43, based on the measured voltage of the test signal V. In the meantime, the arithmetic and logic unit 8 is configured as a computer comprising a Central Processing Unit (CPU), memories such as Random Access Memory (RAM), Read Only Memory (ROM), storage devices such as hard disk drive, software, and interface. The arithmetic and logic unit 8 is configured to achieve the correspondence specifying unit 81 by cooperation of such resources.

In the meantime, the correspondence specifying unit 81 comprises a switch controller unit 811 for controlling a switching operation of each of the first switching device 43 and the second switching device 62, and a determination unit 812 for determining a correspondence between both ends of the insulated wire 3 based on a voltage measuring result or the like of the test signal V.

The determination unit 812 is configured to control the first switching device 43 via the switch controller unit 811 to input the test signal V into the end of the specific insulated wire 3 to be tested as the testing object at one end of the multi-core cable 2, and control the second switching device 62 to sequentially measure the voltages of the test signals corresponding to all the insulated wires 3 at the other end of the multi-core cable 2.

Then, the determination unit 812 specifies the one end with the test signal V having the maximum voltage (highest voltage) from the respective insulated wires 3 being exposed at the other end of the multi-core cable 2, as the other end of the insulated wire 3 which is the testing object, and stores the correspondence in a memory unit 82.

The correspondence between the both ends of the insulated wire 3 is expressed by corresponding, for example, numbers sequentially assigned to the ends of the insulated wires 3 that are arranged to be aligned at one end of the multi-core cable 2 and numbers sequentially assigned to the ends of the insulated wires 3 that are arranged to be aligned at the other end of the multi-core cable 2. The determination unit 812 changes the insulated wires 3 to be tested as the testing object sequentially (one by one), specifies the correspondences between the ends of all the insulated wires 3, and stores the correspondences in the memory unit 82.

(2) Configuration of the Substrate 44

Next, the configuration of the substrate 44 will be explained in more detail with reference to mainly FIGS. 5 and 6. Although a shape of the substrate 44 in a top view is a rectangular shape in FIG. 4 as an example, the present invention is not limited thereto.

As described above, the first electrode 441 to be connected with the signal conductor of the signal transmission cable 47 is provided on one main surface (upper end side in FIG. 5) of the substrate 44. In addition, the second electrode 442 to be capacitively coupled with the conductor 31 of the insulated wire 3 is provided at the position facing one end of the insulated wire 3 on the other main surface (lower end side in FIG. 5) of the substrate 44.

The transmission path 430 for connecting between the first electrode 441 and the second electrode 442 and for transmitting the test signal V between the first electrode 441 and the second electrode 442 is provided in the substrate 44.

The transmission path 430 in the present embodiment comprises not only a portion extending along a thickness direction of the substrate 44 (hereinafter referred to as "vertical transmission path 431"), but also a portion extending along a main surface in-plane direction (creepage surface direction) of the substrate 44 (hereinafter referred to as "surface transmission path 432").

In addition, the substrate 44 in the present embodiment further comprises a shielding layer 449 for suppressing a noise (such as electrostatic noise) from entering into the transmission path 430, in addition to the first electrode 441, the second electrode 442, and the transmission path 430.

A shielding layer 449 comprises at least one of a first shielding layer 447 configured to surround the first electrodes 441 on one main surface while keeping a non-contact state with the first electrodes 441, and a second shielding layer 448 configured to surround the second electrodes 442 on the other main surface while keeping a non-contact state with the second electrodes 442. In the present embodiment, the case where the shielding layer 449 comprises both the first shielding layer 447 and the second shielding layer 448 is described as an example. However, the present embodiment is not limited thereto. The shielding layer 449 may comprise only one of the first shielding layer 447 and the second shielding layer 448.

As described above, a plurality of the first electrodes 441 are provided on one main surface of the substrate 44. As shown in FIG. 6, the first shielding layer 447 is provided to surround all the plurality of the first electrodes 441 collectively on the one main surface of the substrate 44.

Further, as described above, a plurality of the second electrodes 442 are also provided on the other main surface of the substrate 44. As shown in FIG. 6, the second shielding layers 448 are provided to surround each of the second electrodes 442 independently from each other on the other main surface of the substrate 44. Further, a plurality of the second shielding layers 448 are provided to keep a non-contact state from each other on the other main surface of the substrate 44.

The shielding layer 449 further comprises a third shielding layer 444 being provided within the substrate 44 and extending in a planar shape along the main surface in-plane direction of the substrate 44. The shielding layer 449 is configured to sandwich the surface transmission path 432 between the third shielding layer 444 and at least one of the first shielding layer 447 and the second shielding layer 448. FIGS. 5 and 6 show the case where the surface transmission path 432 is sandwiched by the third shielding layer 444 and the first shielding layer 447 as an example. Note that the surface transmission path 432 may be provided between the third shielding layer 444 and the second shielding layer 448. The surface transmission paths 432 may be provided between the third shielding layer 444 and the first shielding layer 447, and between the third shielding layer 444 and the second shielding layer 448.

Note that the substrate 44 may be formed by using well known methods such as the build-up method. The structure of the substrate 44 formed by using the build-up method will be explained below in more detail.

Figure 5:
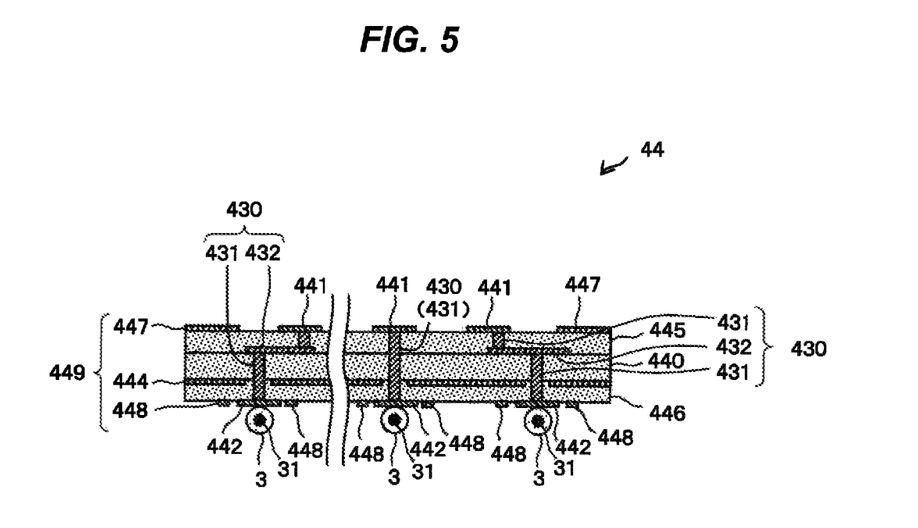
FIG. 5 is a partially enlarged cross-sectional view schematically showing a cross-section of a substrate 44 along a thickness direction of the substrate 44 according to the embodiment of the invention.
Figure 6:
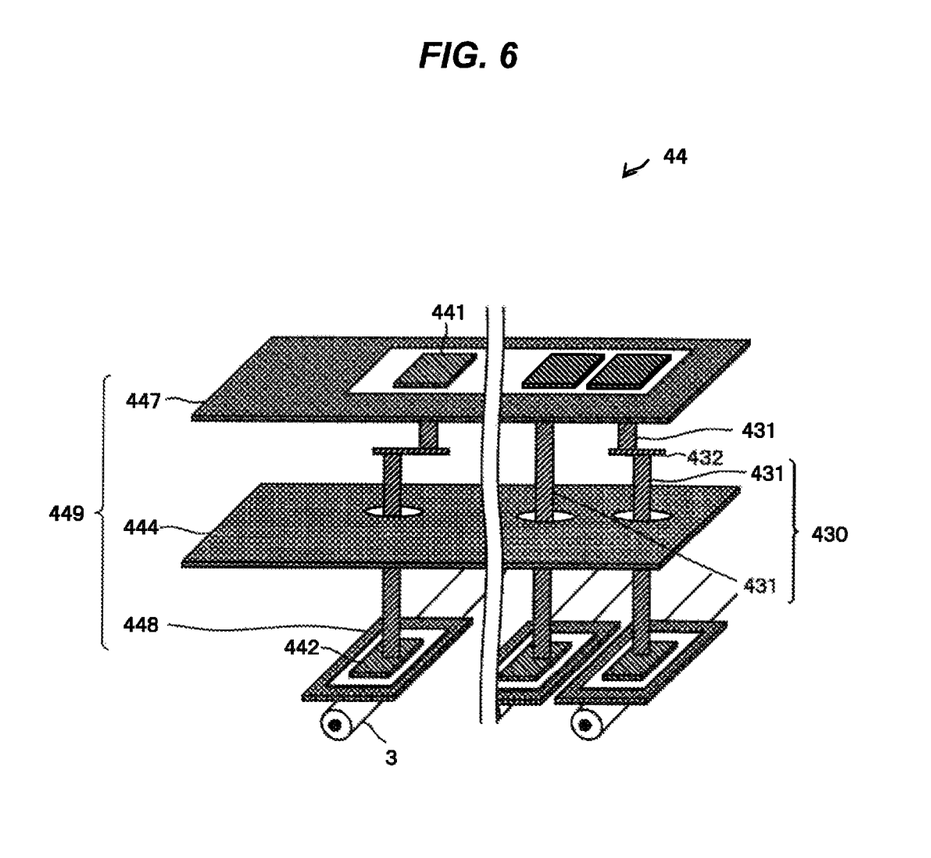
FIG. 6 is a perspective view for partially extracting a main part of the substrate 44 according to the embodiment of the invention.

As shown in FIG. 5, the substrate 44 comprises a planar core member 440, a first prepreg layer 445 and a second prepreg layer 446, which are provided to be bonded to (or additional molded on) both main surfaces of the core member 440. As the core member 440, well-known electrically insulative materials such as a material formed by impregnating and hardening an epoxy resin in glass fibers can be used. Each of the first prepreg layer 445 and the second prepreg layer 446 may be formed by bonding a flat plate made of an electrically insulative material. In the meantime, the first prepreg layer 445 and the second prepreg layer 446 may comprise an insulation layer comprising an electrically insulative molding material having thermo-setting property or photo-curing property.

On a surface of the first prepreg layer 445 constituting one main surface of the substrate 44, the first electrodes 441 and the first shielding layer 447 are provided. The first electrodes 441 and the first shielding layers 447 may be respectively formed by patterning a copper film adhered to the surface of the first prepreg layer 445. As described above, a plurality of the first electrodes 441 are formed on the surface of the first prepreg layer 445. The first shielding layer 447 is formed to collectively surround all the first electrodes 441 on the first prepreg layer 445.

On a surface of the second prepreg layer 446 constituting the other main surface of the substrate 44, the second electrodes 442 and the second shielding layers 448 are provided. The second electrodes 442 and the second shielding layers 448 may be respectively formed by patterning a copper film adhered to the surface of the second prepreg layer 446. As described above, a plurality of the second electrodes 442 are formed on the surface of the second prepreg layer 446. The second shielding layers 448 are formed to surround all of the second electrodes 442 independently from each other on the second prepreg layer 446. In addition, the second shielding layers 448 are formed to be kept in the non-contact state from each other on the surface of the second prepreg layer 446.

Within the substrate 44, the transmission path 430 for connecting between the first electrode 441 and the second electrode 442 is provided. As described above, the first electrode 441 and the second electrode 442 are located in such a manner that the first electrode 441 and the second electrode 442 do not face to each other with sandwiching the substrate 44. The transmission path 430 comprises the vertical transmission path 431 extending along the thickness direction of the substrate 44 and the surface transmission path 432 extending along the main surface in-plane direction (creepage surface direction) of the substrate 44. The vertical transmission path 431 may be made by forming a via-hole which penetrates through at least one of the core member 440, the first prepreg layer 445, and the second prepreg layer 446 in the thickness direction, and filling the via-hole with copper plating etc. The surface transmission path 432 may be formed by patterning a copper film adhered on one main surface of the core member 440.

On a bonding interface between the core member 440 and the second prepreg layer 446, a third shielding layer 444 is provided. The third shielding layer 444 may be composed of e.g., the copper film which is adhered to the other main surface of the core member 440 and mostly remained as a solid pattern.

The first shielding layer 447, the second shielding layer 448, and the third shielding layer 444 are respectively configured not to electrically connect to (not to contact with) the first electrode 441, the second electrode 442, and the transmission path 430. In addition, the first shielding layer 447, the second shielding layer 448, and the third shielding layer 444 are respectively grounded through ground wires (not shown).

(3) Method for Testing the Multi-Core Cable

In the method for testing the multi-core cable according to the present embodiment, firstly, the insulated wires 3 are respectively exposed at the both ends of the multi-core cable 2 by removing the jacket 22 and the shield 21 in a predetermined length. Next, each exposed insulated wire 3 is fitted and fixed to the locking groove 452a of the examining table 45 or the like at the both ends of the multi-core cable 2 without removing the insulative coating layer 32. The capacitive coupling described above is established by pressing the substrates 44, 61 on each insulated wire 3 fixed on the examining table 45 and the other examining table (not shown). Thereafter, a test (inspection) for determining the correspondence between the ends of the insulated wire 3 is performed.

Figure 7:
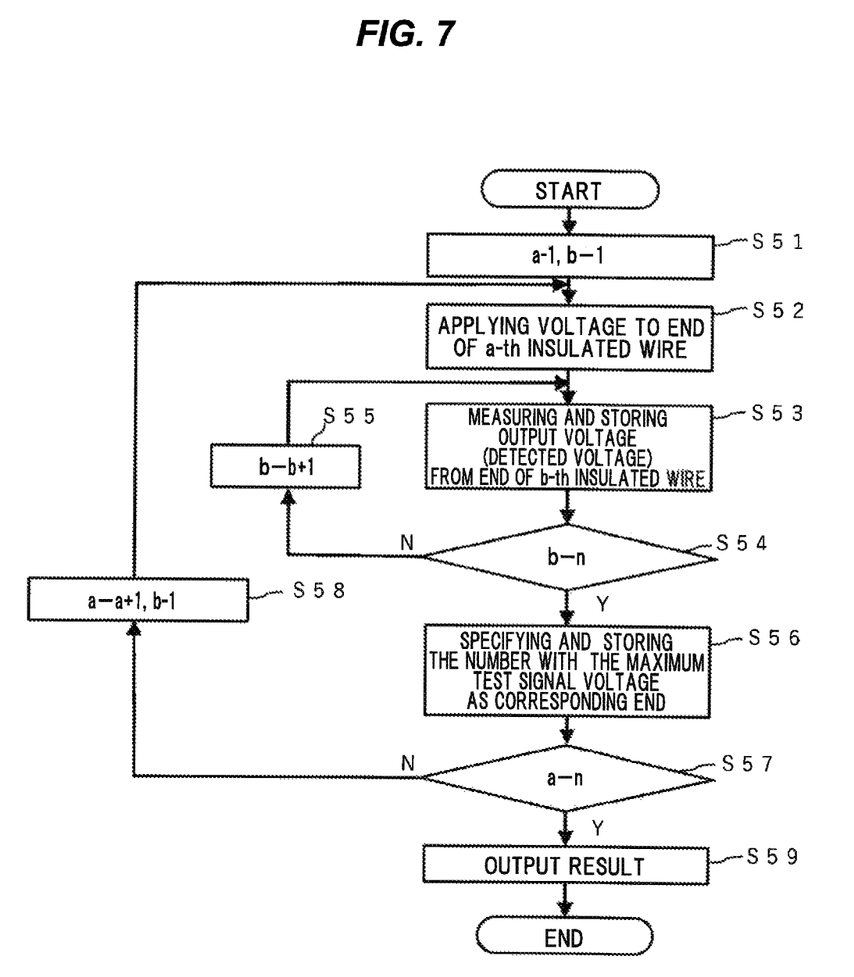
FIG. 7 is a flowchart showing a control flow in testing correspondences between both ends of the insulated wires 3.

FIG. 7 is a flowchart showing a control flow in the arithmetic and logic unit 8 in performing the test for determining the correspondence between the ends of the insulated wire 3. Hereinafter, the number of the insulated wires 3 is defined as "n", and the order of the insulated wires 3 arranged at the examining table 45 is defined as 1, 2, . . . n. The number "n" of the insulated wires 3 is manually input to the arithmetic and logic unit 8.

As shown in FIG. 7, at step S51, the determination unit 812 firstly assigns an initial value "1" in variables a, b. Then, at step S52, the determination unit 812 controls the first switching device 43 through the switch controller unit 811 to apply the test signal V to the a-th insulated wire 3. That is, the test signal V is input by capacitive coupling into an end of the a-th insulated wire 3 to be selected as the testing object from the ends of the insulated wires 3 being exposed at one end of the multi-core cable 2. The other signal including the test signal V is not input into the insulated wires 3 other than the a-th insulated wire 3 that is the testing object.

The test signal V sent from the voltage source 41 included in the signal input unit 4 is transmitted to the first electrode 441 through the signal conductor of the signal transmission cable 47. The test signal V transmitted to the first electrode 441 is transmitted to the second electrode 442 through the transmission path 430. The test signal V transmitted to the second electrode 442 is input by capacitive coupling into the end of the conductor 31 of the insulated wire 3 pressed against the second electrode 442.

Thereafter, at step S53, the determination unit 812 controls the second switching device 62 through the switch controller unit 811 to measure a voltage of the test signal V (the final test signal V consisted of the DC component) output from the end of the b-th insulated wire 3 being exposed at the other end of the multi-core cable 2, and stores the measuring result in association with the variable b (i.e., the number of the end of the insulated wire 3 at the other end side) in the memory unit 82.

At step S54, the determination unit 812 determines whether the variable b is equal to n or not. If the determination unit 812 determines that the variable b is not equal to n (NO) at the step S54, the determination unit 812 increments the variable b at step S55 and returns to the step S53. If the determination unit 812 determines that the variable b is equal to n (YES) at the step S54, i.e., when the measurement of all the insulated wires 3 at the other end side (the signal output unit 6-side) of the multi-core cable 2 is finished, the determination unit 812 specifies the number for which the voltage of the test signal V is the highest (maximum) (the number of the end of the insulated wire 3 at the other end side) as the other end corresponding to the a-th insulated wire 3 which is currently the testing object, and then stores the specified correspondence in the memory unit 82.

At step S57, the determination unit 812 determines whether the variable a is equal to n or not. If the determination unit 812 determines that the variable a is not equal to n (NO) at the step S57, the determination unit 812 increments the variable a at step S58 and changes the variable b into the initial value "1", and then returns to the step S52. If the determination unit 812 determines that the variable a is equal to n (YES) at the step S57, i.e., when the correspondences for all the insulate wires 3 at the one end side (the signal input unit 4-side) of the multi-core cable 2 are specified, the determination unit 812 goes to step S59. At the step S59, the arithmetic and logic unit 8 outputs a specifying result of the correspondences stored in the memory unit 82 to e.g., monitor, and then the process is ended.

(4) Advantageous Effects of the Present Embodiment

The present embodiment exhibits one or more effects described below.

(a) Since the shielding layer 449 is provided on the substrate 44 according to the present embodiment, it is possible to suppress the noise from entering into the transmission path 430 at the time of sending the test signal V. As a result, the correspondence between the ends of the insulated wire 3 can be stably and accurately specified.

(b) The substrate 44 according to the present embodiment comprises at least one of the first shielding layer 447 on one main surface, which surrounds the first electrodes 441 while keeping the non-contact state with the first electrodes 441, or the second shielding layer 448 on the other main surface, which surrounds the second electrodes 442 while keeping the non-contact state with the second electrodes 442. Hereby, it is possible to suppress the noise from entering into the transmission path 430 in at least one of one main surface direction of the substrate 44 or the other main surface direction of the substrate 44. As a result, the correspondence between the ends of the insulated wire 3 can be stably and accurately specified.

(c) The first shielding layer 447 according to the present embodiment is provided to collectively surround all of the plurality of first electrodes 441. Hereby, it is possible to suppress the noise from entering along the one main surface direction of the substrate 44 into the transmission paths 430 respectively connected to the first electrodes 441. As a result, the correspondence between the ends of the insulated wire 3 can be stably and accurately specified.

(d) The second shielding layers 448 are provided to surround the plurality of second electrodes 442 independently from each other. Hereby, it is possible to suppress the noise from entering along the other main surface direction of the substrate 44 into the transmission paths 430 respectively connected to the second electrodes 442. As a result, the correspondence between the ends of the insulated wire 3 can be stably and accurately specified.

(e) The second shielding layers 448 according to the present embodiment are provided to be kept in the non-contact state from each other. Hereby, it is possible to suitably adjust (decrease) the shielding force of the second shielding layers 448. As a result, it is possible to suppress the deterioration in detection sensitivity of the correspondence between the ends of the insulated wire 3. As a result, the correspondence between the ends of the insulated wire 3 can be stably and accurately specified.

(f) The transmission path 430 according to the present embodiment comprises a portion (surface transmission path 432) being provided within the substrate and extending along the main surface in-plane direction (creepage surface direction) to connect between the first electrode 441 and the second electrode 442. Hereby, it is possible to increase the arrangement interval between the plurality of insulated wires 3 fixed on the examining table 45, and to ensure a large interval between the adjacent insulated wires 3 by such configuration. Thus, it is possible to easily and speedy fix the insulated wires 3 on the examining table 45. In addition, the correspondence between the ends of the insulated wire 3 can be stably and accurately specified.

(g) The third shielding layer 444 according to the present embodiment is provided within the substrate 44 to extend planarly along the main surface in-plane direction of the substrate 44, and is configured to sandwich a portion of the transmission path 430 (the surface transmission path 432) that extends along the main surface in-plane direction (creepage surface direction) of the substrate 44 between the third shielding layer 444 and the first shielding layer 447. Hereby it is possible to suppress the noise from entering into the surface transmission path 432 into which the noise is easily entered. As a result, the correspondence between the ends of the insulated wire 3 can be stably and accurately specified.

Other Embodiments

Although the embodiment of the present invention is explained in detail, the present invention in not limited to the embodiment. The various kinds of modifications can be implemented without departing from the gist of the invention.

Although the above embodiment relates to the case where both the signal input unit 4 and the signal output unit 6 comprise the substrate including the shielding layer for suppressing the noise from entering into the transmission path, the present invention is not limited thereto. For example, one of the signal input unit 4 and the signal output unit 6 may comprise the substrate including the shielding layer. In such a case, it is possible to achieve substantially the same effect as the above embodiment.

Although the above embodiment relates to the case where the substrate 44 comprises all of the first shielding layer 447, the second shielding layer 448, and the third shielding layer 444, the present invention is not limited thereto. The substrate 44 may comprise at least one of the first shielding layer 447, the second shielding layer 448, and the third shielding layer 444. In such a case, it is possible to achieve substantially the same effect as the above embodiment.

Although the above embodiment relates to the case where the first shielding layer 447 is provided to collectively surround all of the first electrodes 441 on the one main surface of the substrate 44, the present invention is not limited thereto. For example, the first shielding layers 447 may be provided to surround the plurality of first electrodes 441 independent from each other on the one main surface of the substrate 44. In such a case, the first shielding layers 447 may be provided to be kept in the non-contact state from each other on the one main surface of the substrate 44. In such case, it is possible to achieve substantially the same effect as the above embodiment.

Although the above embodiment relates to the case where the second shielding layers 448 are formed to be kept in the non-contact state from each other on the other main surface of the substrate 44, the present invention is not limited thereto. Any combination of two or more of the second shielding layers 448 may be selected and electrically connected to each other. In addition, the second shielding layer 448 may be provided to collectively surround all of the plurality of second electrodes 442 on the other main surface of the substrate 44. In such a case, it is possible to achieve substantially the same effect as the above embodiment.

Although the above embodiment relates to the case where the arrangement interval between the second electrodes 442 on the other main surface of the substrate 44 is larger than the arrangement interval between the first electrodes 441 on one main surface of the substrate 44, and the first electrode 441 and the second electrode 442 are provided not to face to each other while sandwiching the substrate 44, the present invention is not limited thereto. It is possible to freely set these arrangement intervals. It is possible to set the same arrangement interval on the both main surfaces, or it is possible to reverse the magnitude relationship between the arrangement intervals on the both main surfaces. In such case, it is possible to achieve substantially the same effect as the above embodiment.

Preferred Embodiments of the Present Invention

Next, the preferred embodiments of the present invention will be noted as follows.

(Note 1)

One embodiment of the invention provides a multi-core cable testing device configured to specify a correspondence between ends of an insulated wire at both ends of a multi-core cable comprising a plurality of insulated wires, comprising:

a signal input unit configured to input a test signal by capacitive coupling into one end of the insulated wire selected as a testing object from ends of the plurality of insulated wires being exposed at an end of the multi-core cable;

a signal output unit configured to output the test signal by capacitive coupling from each end of the plurality of insulated wires being exposed at an other end of the multi-core cable; and a correspondence specifying unit configured to measure a voltage of the test signal obtained from the signal output unit and to specify an other side end of the insulated wire as the testing object based on a measured voltage, wherein at least one of the signal input unit and the signal output unit comprises a signal transmission cable for transmitting the test signal and a substrate configured to be connected to the signal transmission cable, wherein a first electrode configured to be connected to a signal conductor of the signal transmission cable is provided on one main surface of the substrate, wherein a second electrode configured to be capacitively coupled with an end of the insulated wire is provided on an other main surface of the substrate, wherein a transmission path configured to transmit the test signal between the first electrode and the second electrode is provided within the substrate, and wherein a shielding layer configured to suppress a noise from entering into the transmission path is provided at the substrate.

(Note 2)

Preferably, in the multi-core cable testing device according to Note 1, the shielding layer comprises at least one of a first shielding layer surrounding the first electrode on the one main surface while keeping a non-contact state with the first electrode, and a second shielding layer surrounding the second electrode on the other main surface while keeping a non-contact state with the second electrode.

(Note 3)

Preferably, in the multi-core cable testing device according to Note 2, a plurality of the first electrodes are provided on the one main surface, and the first shielding layer is provided to collectively surround all of the plurality of first electrodes on the one main surface.

(Note 4)

Preferably, in the multi-core cable testing device according to Note 2 or 3, a plurality of the second electrodes are provided on the other one main surface, and the second shielding layer is provided to surround the plurality of second electrodes independent from each other on the other one main surface.

(Note 5)

Preferably, in the multi-core cable testing device according to Note 4, a plurality of the second shielding layers are provided to keep a non-contact state with each other on the other main surface.

(Note 6)

Preferably, in the multi-core cable testing device according to any one of Notes 2 to 5, the first electrode and the second electrode are located in such a manner that the first electrode and the second electrode does not face to each other while sandwiching the substrate, and the transmission path comprises a portion being provided within the substrate and extending along a main surface in-plane direction of the substrate to connect between the first electrode and the second electrode.

(Note 7)

Preferably, in the multi-core cable testing device according to Note 6, the shielding layer comprises a third shielding layer being provided within the substrate and extending planarly along a main surface in-plane direction of the substrate, and the third shielding layer and at least one of the first shielding layer and the second shielding layer configures to sandwich a part of the transmission path, which extends along a main surface in-plane direction of the substrate.

(Note 8)

Another embodiment of the present invention provides a method for testing a multi-core cable for specifying a correspondence between ends of an insulated wire at both ends of the multi-core cable comprising a plurality of insulated wires, comprising:

inputting a test signal by capacitive coupling into one end of the insulated wire selected as a testing object from ends of the plurality of insulated wires being exposed at an end of the multi-core cable;

outputting the test signal by capacitive coupling from each end of the plurality of insulated wires being exposed at an other end of the multi-core cable; and measuring a voltage of the test signal obtained from the signal output unit and specifying an other side end of the insulated wire as the testing object based on a measured voltage, wherein, in at least one of the step of inputting the test signal and the step of outputting the test signal, a substrate including a first electrode configured to be connected to a signal conductor of a signal transmission cable for transmitting the test signal on one main surface of the substrate, a second electrode provided on an other main surface of the substrate, and a transmission path configured to transmit the test signal between the first electrode and the second electrode within the substrate is used to capacitively couple the second electrode with an end of the insulated wire, and wherein a shielding layer provided at the substrate suppresses a noise from entering into the transmission path.

Although the embodiments of the invention have been described, the invention according to claims is not to be limited to the embodiments. In addition, please note that all combinations of the features described in the embodiments are not necessary to solve the problem of the invention. Furthermore, the various kinds of modifications can be implemented without departing from the gist of the invention.

What is claimed is:

1. A multi-core cable testing device configured to specify a correspondence between ends of an insulated wire at both ends of a multi-core cable comprising a plurality of insulated wires, comprising:
    a signal input unit configured to input a test signal by capacitive coupling into one end of the insulated wire selected as a testing object from ends of the plurality of insulated wires being exposed at an end of the multi-core cable;
    a signal output unit configured to output the test signal by capacitive coupling from each end of the plurality of insulated wires being exposed at an other end of the multi-core cable; and
    a correspondence specifying unit configured to measure a voltage of the test signal obtained from the signal output unit and to specify an other side end of the insulated wire as the testing object based on a measured voltage,
    wherein at least one of the signal input unit and the signal output unit comprises a signal transmission cable for transmitting the test signal and a substrate configured to be connected to the signal transmission cable,
    wherein a first electrode configured to be connected to a signal conductor of the signal transmission cable is provided on one main surface of the substrate,
    wherein a second electrode configured to be capacitively coupled with an end of the insulated wire is provided on an other main surface of the substrate,
    wherein a transmission path configured to transmit the test signal between the first electrode and the second electrode is provided within the substrate, and
    wherein a shielding layer configured to suppress a noise from entering into the transmission path is provided at the substrate.

2. The multi-core cable testing device according to claim 1, wherein the shielding layer comprises at least one of a first shielding layer surrounding the first electrode on the one main surface while keeping a non-contact state with the first electrode, and a second shielding layer surrounding the second electrode on the other main surface while keeping a non-contact state with the second electrode.

3. The multi-core cable testing device according to claim 2, wherein a plurality of the first electrodes are provided on the one main surface, and the first shielding layer is provided to collectively surround all of the plurality of first electrodes on the one main surface.

4. The multi-core cable testing device according to claim 2, wherein a plurality of the second electrodes are provided on the other one main surface, and wherein the second shielding layer is provided to surround the plurality of second electrodes independent from each other on the other one main surface.

5. The multi-core cable testing device according to claim 4, wherein a plurality of the second shielding layers are provided to keep a non-contact state with each other on the other main surface.

6. The multi-core cable testing device according to claim 2, wherein the first electrode and the second electrode are located in such a manner that the first electrode and the second electrode does not face to each other while sandwiching the substrate, and
    wherein the transmission path comprises a portion being provided within the substrate and extending along a main surface in-plane direction of the substrate to connect between the first electrode and the second electrode.

7. The multi-core cable testing device according to claim 6, wherein the shielding layer comprises a third shielding layer being provided within the substrate and extending planarly along a main surface in-plane direction of the substrate, and the third shielding layer and at least one of the first shielding layer and the second shielding layer configures to sandwich a part of the transmission path, which extends along a main surface in-plane direction of the substrate.

8. A method for testing a multi-core cable for specifying a correspondence between ends of an insulated wire at both ends of the multi-core cable comprising a plurality of insulated wires, comprising:
    inputting a test signal by capacitive coupling into one end of the insulated wire selected as a testing object from ends of the plurality of insulated wires being exposed at an end of the multi-core cable;
    outputting the test signal by capacitive coupling from each end of the plurality of insulated wires being exposed at an other end of the multi-core cable; and
    measuring a voltage of the test signal obtained from the signal output unit and specifying an other side end of the insulated wire as the testing object based on a measured voltage,
    wherein, in at least one of the step of inputting the test signal and the step of outputting the test signal, a substrate including a first electrode configured to be connected to a signal conductor of a signal transmission cable for transmitting the test signal on one main surface of the substrate, a second electrode provided on an other main surface of the substrate, and a transmission path configured to transmit the test signal between the first electrode and the second electrode within the substrate is used to capacitively couple the second electrode with an end of the insulated wire, and
    wherein a shielding layer provided at the substrate suppresses a noise from entering into the transmission path.

* * * * *